(12) United States Patent
Shur et al.

(10) Patent No.: US 9,960,321 B2
(45) Date of Patent: May 1, 2018

(54) MULTI-LAYERED CONTACT TO SEMICONDUCTOR STRUCTURE

(71) Applicant: Sensor Electronic Technology, Inc., Columbia, SC (US)

(72) Inventors: Michael Shur, Latham, NY (US); Alexander Dobrinsky, Loudonville, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days. days.

(21) Appl. No.: 15/198,569

(22) Filed: Jun. 30, 2016

(65) Prior Publication Data

US 2017/0005246 A1    Jan. 5, 2017

Related U.S. Application Data

(60) Provisional application No. 62/187,718, filed on Jul. 1, 2015.

(51) Int. Cl.
| | |
|---|---|
| *H01L 33/42* | (2010.01) |
| *H01L 23/00* | (2006.01) |
| *H01L 31/00* | (2006.01) |
| *H01L 33/32* | (2010.01) |
| *H01L 33/10* | (2010.01) |
| *H01L 33/40* | (2010.01) |

(Continued)

(52) U.S. Cl.
CPC .............. *H01L 33/42* (2013.01); *H01L 24/00* (2013.01); *H01L 31/00* (2013.01); *H01L 33/10* (2013.01); *H01L 33/32* (2013.01); *H01L 33/40* (2013.01); *H01L 2933/0016* (2013.01); *H01S 5/0224* (2013.01); *H01S 5/0421* (2013.01); *H01S 5/34333* (2013.01)

(58) Field of Classification Search
CPC ............. H01L 21/76804; H01L 23/293; H01L 23/3171; H01L 24/03; H01L 24/741; H01L 24/00; H01L 33/32; H01L 33/42; H01L 33/10; H01L 33/40; H01S 5/0224; H01S 5/0421; H01S 5/343
See application file for complete search history.

(56) References Cited

U.S. PATENT DOCUMENTS

| | | |
|---|---|---|
| 8,766,448 B2 | 7/2014 | Gaska et al. |
| 9,064,845 B2 | 6/2015 | Gaska et al. |

(Continued)

OTHER PUBLICATIONS

Jang, G., International Application No. PCT/US2016/040375, International Search Report and Written Opinion, Oct. 14, 2016, 10 pages.

*Primary Examiner* — Dale E Page
*Assistant Examiner* — Quovaunda V Jefferson
(74) *Attorney, Agent, or Firm* — Labatt, LLC

(57) ABSTRACT

A multi-layered contact to a semiconductor structure and a method of making is described. In one embodiment, the contact includes a discontinuous Chromium layer formed over the semiconductor structure. A discontinuous Titanium layer is formed directly on the Chromium layer, wherein portions of the Titanium layer extend into at least some of the discontinuous sections of the Chromium layer. A discontinuous Aluminum layer is formed directly on the Chromium layer, wherein portions of the Aluminum layer extend into at least some of the discontinuous sections of the Titanium layer and the Chromium layer.

17 Claims, 9 Drawing Sheets

(51) Int. Cl.
   *H01S 5/022*   (2006.01)
   *H01S 5/042*   (2006.01)
   *H01S 5/343*   (2006.01)

(56) References Cited

U.S. PATENT DOCUMENTS

| | | |
|---|---|---|
| 2002/0093023 A1* | 7/2002 | Camras .................. H01L 33/02 257/94 |
| 2005/0205993 A1* | 9/2005 | Yamaguchi ......... H01L 23/3114 257/738 |
| 2008/0315419 A1* | 12/2008 | Gaska .................. H01L 23/482 257/751 |
| 2010/0308366 A1 | 12/2010 | Kang et al. |
| 2011/0198733 A1* | 8/2011 | Tomisaka .......... H01L 21/76804 257/622 |
| 2011/0210363 A1 | 9/2011 | Lee |
| 2013/0026525 A1 | 1/2013 | Chen et al. |
| 2013/0049053 A1 | 2/2013 | Kususe et al. |
| 2015/0287602 A1 | 10/2015 | Gaska et al. |

* cited by examiner

MULTI-LAYERED CONTACT TO SEMICONDUCTOR STRUCTURE

REFERENCE TO RELATED APPLICATIONS

The present patent application claims the benefit of U.S. Provisional Application No. 62/187,718, which was filed on 1 Jul. 2015; and which is hereby incorporated by reference.

TECHNICAL FIELD

The present invention relates generally to device contacts, and more particularly, to contacts for a semiconductor device, such as a group III Nitride semiconductor device.

BACKGROUND ART

The formation of a contact for a semiconductor structure is a relevant process in fabricating the semiconductor device. For example, contact resistance significantly affects the performance characteristics of the corresponding semiconductor device. As a result, achieving a low contact resistance is typically desired. Other desirable characteristics include contact stability, surface morphology, reliability, and linearity, especially at large currents.

In order to achieve a low contact resistance for Gallium Nitride (GaN) devices, several contact metals and a relatively high annealing temperature are typically utilized to form the contact. Aluminum (Al) is widely used in ohmic contacts because of its low melting point of 660 degrees Celsius. Additionally, Titanium (Ti) or Chromium (Cr) is used as the first layer for the contact because of its low metal work function to GaN. For example, one approach forms a Ti/Al-based contact to an n-type GaN semiconductor having several metals, such as Ti/Al/Ti/Gold (Au) or Ti/Al/Nickel (Ni)/Au, with a thickness ranging from five nanometers to five microns, and which is annealed at 400 degrees Celsius or more. A different approach reverses the order of Ti and Al, and forms an Al/Ti-based contact to an n-type GaN semiconductor that includes Al/Ti/Platinum(Pt)/Au and is annealed at temperatures between 400 and 600 degrees Celsius. Other approaches form a Cr/Al-based contact to an n-type GaN semiconductor that include various metal configurations, such as Cr/Al/Cr/Au, Cr/Al/Pt/Au, Cr/Al/Lead (Pd)/Au, Cr/Al/Ti/Au, Cr/Al/Cobalt(Co)/Au, and Cr/Al/Ni/Au.

To date, a Ti/Al-based contact yields a lower contact resistance than a Cr/Al-based contact, while requiring a higher temperature annealing for the contact alloy. However, the Ti/Al-based n-contact is not reliable for 265 nanometer (nm) and shorter wavelength ultraviolet (UV) light emitting diodes (LEDs). The Cr/Al-based contact has a lower annealing temperature, but a higher contact resistance, than the Ti/Al-based contact. Because of the lower annealing temperature, the surface morphology of the Cr/Al-based contact is better than that of the Ti/Al-based contact.

Various research has been devoted to improving the Ti/Al-based contacts and the Cr/Al-based contacts. In one approach, a Cr/Ti/Al-based contact with continuous layers was proposed.

SUMMARY OF THE INVENTION

This Summary Of The Invention introduces a selection of certain concepts in a brief form that are further described below in the Detailed Description Of The Invention. It is not intended to exclusively identify key features or essential features of the claimed subject matter set forth in the Claims, nor is it intended as an aid in determining the scope of the claimed subject matter.

Aspects of the present invention provide a multi-layered contact to a semiconductor structure. The multi-layered contact can include layers of Chromium, Titanium and Aluminum. Using layers of Chromium, Titanium and Aluminum can result in a contact with the combined advantages of the aforementioned Titanium/Aluminum-based and Chromium/Aluminum-based contacts. In addition, the Chromium, Titanium and Aluminum layers of the multi-layered contact can be discontinuous and have some interpenetrating layers. In one embodiment, a discontinuous Chromium layer can be formed over the semiconductor structure. A discontinuous Titanium layer can be formed directly on the Chromium layer, wherein portions of the Titanium layer extend into at least some of the discontinuous sections of the Chromium layer. A discontinuous Aluminum layer can be formed directly on the Titanium layer, wherein portions of the Aluminum layer extend into at least some of the discontinuous sections of the Titanium layer and the Chromium layer.

Formation of the multi-layered contact with discontinuous and some interpenetrating layers can include annealing. For example, the Chromium layer can be annealed after formation on the semiconductor structure, the Titanium layer can be annealed after formation of the Titanium layer on the Chromium layer, and the Aluminum layer can be annealed after formation of the Aluminum layer on the Titanium layer. In another example, the Chromium layer, the Titanium layer, and the Aluminum layer can be annealed after all have been formed on the semiconductor structure.

In another embodiment, formation of the multi-layered contact with discontinuous and some interpenetrating layers can include the deposition of the layers, direct patterning of the layers using photolithography, deposition of thin layers and subsequent annealing, or a combination of two or more of these approaches.

The multi-layered contact with discontinuous and some interpenetrating layers of Chromium, Titanium and Aluminum can have one or more advantages over the aforementioned Titanium/Aluminum-based and Chromium/Aluminum-based contacts. For example, the multi-layered contact of the various embodiments described herein can: reduce a contact resistance; provide an improved surface morphology; provide better contact linearity; and/or have a lower annealing temperature; as compared to the aforementioned Titanium/Aluminum-based and Chromium/Aluminum-based contacts.

A first aspect of the invention provides a device, comprising: a semiconductor structure; a contact to the semiconductor structure, comprising: a discontinuous Chromium layer formed over the semiconductor structure; a discontinuous Titanium layer formed directly on the Chromium layer, wherein portions of the Titanium layer extend into at least some discontinuous sections of the Chromium layer; and a discontinuous Aluminum layer formed directly on the Titanium layer, wherein portions of the Aluminum layer extend into at least some discontinuous sections of the Titanium layer and the Chromium layer.

A second aspect of the invention provides a device, comprising: a semiconductor structure; at least one semiconductor interlayer formed on the semiconductor structure, each semiconductor interlayer patterned with a plurality of patterns, each pattern separated from adjacent patterns by a predetermined spacing; a contact to the semiconductor structure through the at least one semiconductor interlayer, wherein the contact comprises a discontinuous contact having a discontinuous Chromium layer, a discontinuous Titanium layer formed on the Chromium layer, and a discontinuous Aluminum layer formed on the Titanium layer, wherein the Chromium layer, the Titanium layer and the Aluminum layer of the discontinuous contact are formed in each semiconductor interlayer, in the spacing between each of the plurality of patterns formed therein.

A third aspect of the invention provides a method, comprising: forming a contact to the semiconductor structure, the contact including a Chromium layer, a Titanium layer and an Aluminum layer; annealing the contact to form a discontinuous Chromium layer over the semiconductor structure, a discontinuous Titanium layer directly on the Chromium layer, wherein portions of the Titanium layer extend into at least some discontinuous sections of the Chromium layer, and a discontinuous Aluminum layer directly on the Titanium layer, wherein portions of the Aluminum layer extend into at least some discontinuous sections of the Titanium layer and the Chromium layer.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the present invention taken in conjunction with the accompanying drawings that depict various aspects of the invention.

FIG. 6A shows a schematic of a multi-layered contact to a semiconductor structure through a semiconductor layer having a high concentration of free carriers according to an embodiment of the present invention, while

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the present invention provide a multi-layered contact to a semiconductor structure. The multi-layered contact can include layers of Chromium, Titanium and Aluminum. Using layers of Chromium, Titanium and Aluminum can result in a contact with the combined advantages of the aforementioned Titanium/Aluminum-based and Chromium/Aluminum-based contacts. In addition, the Chromium, Titanium and Aluminum layers of the multi-layered contact can be discontinuous and have some interpenetrating layers. In one embodiment, a discontinuous Chromium layer can be formed over the semiconductor structure. A discontinuous Titanium layer can be formed directly on the Chromium layer, wherein portions of the Titanium layer extend into some discontinuous sections of the Chromium layer. A discontinuous Aluminum layer can be formed directly on the Titanium layer, wherein portions of the Aluminum layer extend into some discontinuous sections of the Titanium layer and the Chromium layer.

Formation of the multi-layered contact with discontinuous and some interpenetrating layers can include annealing. For example, the Chromium layer can be annealed after formation on the semiconductor structure, the Titanium layer can be annealed after formation of the Titanium layer on the Chromium layer, and the Aluminum layer can be annealed after formation of the Aluminum layer on the Titanium layer. In another example, the Chromium layer, the Titanium layer, and the Aluminum layer can be annealed after formation on the semiconductor structure.

In another embodiment, formation of the multi-layered contact with discontinuous and some interpenetrating layers can include the deposition of the layers, direct patterning of the layers using photolithography, deposition of thin layers and subsequent annealing, or a combination of two or more of these approaches.

The multi-layered contact with discontinuous layers of Chromium, Titanium and Aluminum with some being interpenetrating can have one or more advantages over the aforementioned Titanium/Aluminum-based and Chromium/Aluminum-based contacts. For example, the multi-layered contact of the various embodiments described herein can: reduce a contact resistance, provide an improved surface morphology, provide better contact linearity; and/or have a lower annealing temperature; as compared to the aforementioned Titanium/Aluminum-based and Chromium/Aluminum-based contacts. As used herein, unless otherwise noted, the term "set" means one or more (i.e., at least one) and the phrase "any solution" means any now known or later developed solution.

Figure 1:
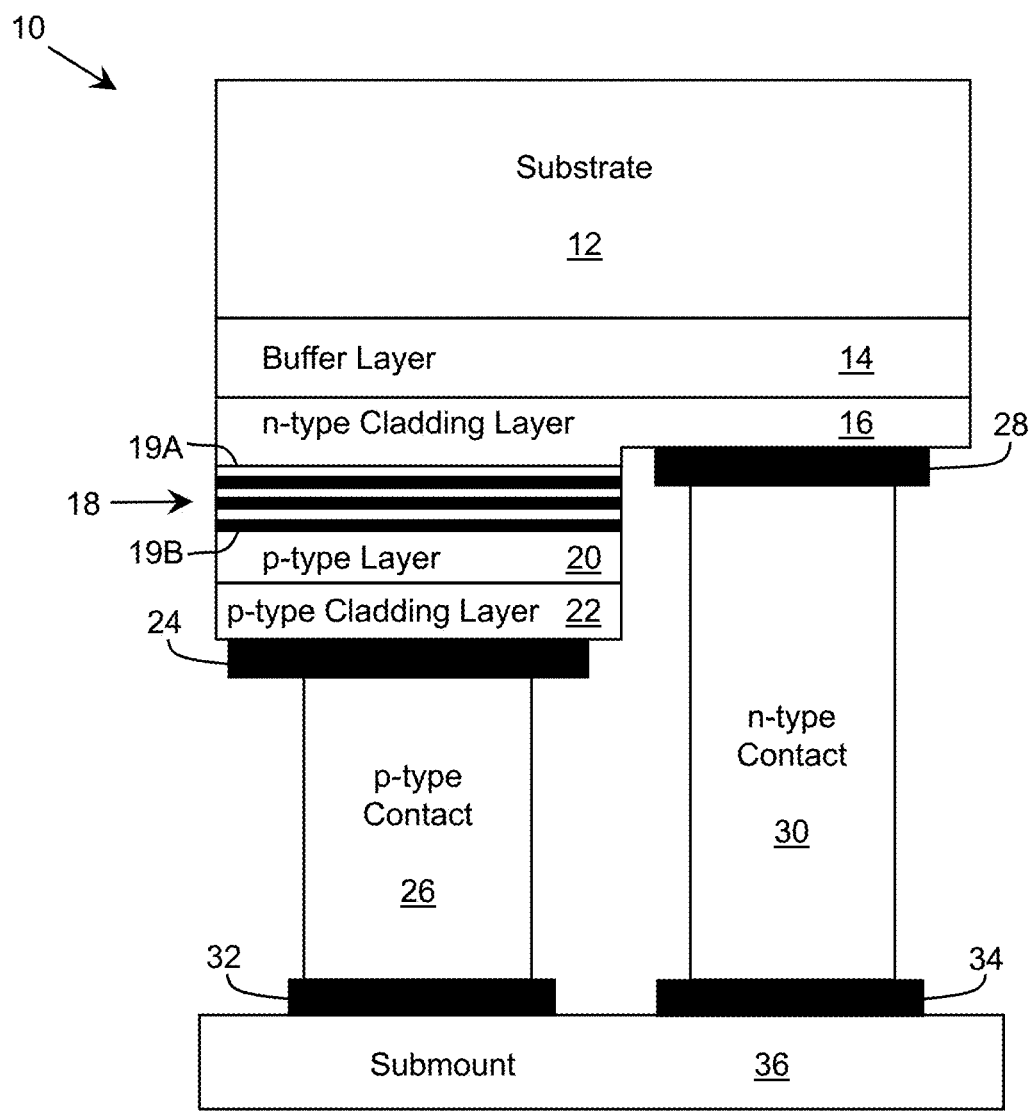
FIG. 1 shows a schematic structure of an illustrative optoelectronic device according to an embodiment of the present invention.

Turning to the drawings, FIG. 1 shows a schematic structure of an illustrative optoelectronic device 10 according to an embodiment of the present invention. In a more particular embodiment, the optoelectronic device 10 is configured to operate as an emitting device, e.g., a light emitting diode (LED), such as a conventional or super luminescent LED. Alternatively, the optoelectronic device 10 can be configured to operate as a light emitting solid state laser, a laser diode (LD), a photo-detector, a photodiode, a high-electron mobility transistor (HEMT), or another type of optoelectronic device. Additional aspects of the invention are shown and described in conjunction with an emitting device 10. However, it is understood that embodiments can be utilized in conjunction with any type of optoelectronic device and/or any type of group III nitride-based device.

When operated as an emitting device 10, application of a bias comparable to the band gap results in the emission of electromagnetic radiation from an active region 18 of the emitting device 10. The electromagnetic radiation emitted by the emitting device 10 can comprise a peak wavelength within any range of wavelengths, including visible light, ultraviolet radiation, deep ultraviolet radiation, infrared light, and/or the like. In an embodiment, the emitting device 10 is configured to emit radiation having a dominant wavelength within the ultraviolet range of wavelengths. In a more specific embodiment, the dominant wavelength is within a range of wavelengths between approximately 210 and approximately 350 nanometers.

The emitting device 10 can include a heterostructure comprising a substrate 12, a buffer layer 14 adjacent to the substrate 12, an n-type cladding layer 16 (e.g., an electron supply layer) adjacent to the buffer layer 14, and the active region 18 having an n-type side 19A adjacent to the n-type cladding layer 16. Furthermore, the heterostructure of the emitting device 10 includes a p-type layer 20 (e.g., an electron blocking layer) adjacent to a p-type side 19B of the active region 18 and a p-type cladding layer 22 (e.g., a hole supply layer) adjacent to the p-type layer 20.

In a more particular illustrative embodiment, the emitting device 10 can be a group III-V materials based device, in which some or all of the various layers are formed of elements selected from the group III-V materials system. In a still more particular illustrative embodiment, the various layers of the emitting device 10 can be formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials can include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based emitting device 10 can include an active region 18 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, both the n-type cladding layer 16 and the p-type layer 20 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, and 20. The substrate 12 can be sapphire, silicon carbide (SiC), silicon (Si), GaN, AlGaN, AlON, LiGaO$_2$, or another suitable material, and the buffer layer 14 can be composed of AlN, an AlGaN/AlN superlattice, and/or the like.

As shown with respect to the emitting device 10, a p-type metal 24 can be attached to the p-type cladding layer 22 and a p-type contact 26 can be attached to the p-type metal 24. Similarly, an n-type metal 28 can be attached to the n-type cladding layer 16 and an n-type contact 30 can be attached to the n-type metal 28. The p-type metal 24 and the n-type metal 28 can form p-type and n-type ohmic contacts, respectively, to the corresponding layers 22, 16, respectively. It is understood that a contact formed between two layers is considered "ohmic" or "conducting" when an overall resistance of the contact is no larger than the larger of the following two resistances: a contact resistance such that a voltage drop at the contact-semiconductor junction is no larger than two volts; and a contact resistance at least five times smaller than a resistance of a largest resistive element or layer of a device including the contact.

In an embodiment, the p-type metal 24 and/or the n-type metal 28 can comprise several conductive and reflective metal layers, while the n-type contact 30 and/or the p-type contact 26 can comprise highly conductive metal. In an embodiment, the p-type cladding layer 22 and/or the p-type contact 26 can be transparent (e.g., semi-transparent or transparent) to the electromagnetic radiation generated by the active region 18. For example, the p-type cladding layer 22 and/or the p-type contact 26 can comprise a short period superlattice lattice structure, such as a transparent magnesium (Mg)-doped AlGaN/AlGaN short period superlattice structure (SPSL). Furthermore, the p-type contact 26 and/or the n-type contact 30 can be reflective of the electromagnetic radiation generated by the active region 18. In another embodiment, the n-type cladding layer 16 and/or the n-type contact 30 can be formed of a short period superlattice, such as an AlGaN SPSL, which is transparent to the electromagnetic radiation generated by the active region 18.

As used herein, a layer is transparent to radiation of a particular wavelength when the layer allows a significant amount of the radiation radiated at a normal incidence to an interface of the layer to pass there through. For example, a layer can be configured to be transparent to a range of radiation wavelengths corresponding to a peak emission wavelength for the light (such as ultraviolet light or deep ultraviolet light) emitted by the active region 18 (e.g., peak emission wavelength+/−five nanometers). As used herein, a layer is transparent to radiation if it allows more than approximately five percent of the radiation to pass there through. In a more particular embodiment, a transparent layer is configured to allow more than approximately ten percent of the radiation to pass there through. Similarly, a layer is reflective when the layer reflects at least a portion of the relevant electromagnetic radiation (e.g., light having wavelengths close to the peak emission of the active region). In an embodiment, a reflective layer is configured to reflect at least approximately five percent of the radiation. In a more particular embodiment, a reflective layer has a reflectivity of at least thirty percent for radiation of the particular wavelength radiated normally to the surface of the layer. In a more particular embodiment, a highly reflective layer has a reflectivity of at least seventy percent for radiation of the particular wavelength radiated normally to the surface of the layer.

As further shown with respect to the emitting device 10, the device 10 can be mounted to a submount 36 via the contacts 26, 30. In this case, the substrate 12 is located on the top of the emitting device 10. To this extent, the p-type contact 26 and the n-type contact 30 can both be attached to a submount 36 via contact pads 32, 34, respectively. The submount 36 can be formed of aluminum nitride (AlN), silicon carbide (SiC), and/or the like.

Any of the various layers of the emitting device 10 can comprise a substantially uniform composition or a graded composition. For example, a layer can comprise a graded composition at a heterointerface with another layer. In an embodiment, the p-type layer 20 comprises a p-type blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the emitting device 10 described herein is only illustrative. To this extent, an emitting device/heterostructure can include an alternative layer configuration, one or more additional layers, and/or the like. As a result, while the various layers are shown immediately adjacent to one another (e.g., contacting one another), it is understood that one or more intermediate layers can be present in an emitting device/heterostructure. For example, an illustrative emitting device/heterostructure can include an undoped layer between the active region 18 and one or both of the p-type cladding layer 22 and the n-type cladding layer 16 (electron supply layer).

Furthermore, an emitting device/heterostructure can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the p-type cladding layer 22 and the active region 18. Similarly, a device/heterostructure can include a p-type layer located between the p-type cladding layer 22 and the active region 18. The DBR structure and/or the p-type layer can comprise any composition based on a desired wavelength of the light generated by the device/heterostructure. In one embodiment, the DBR structure comprises a Mg, Mn, Be, or Mg+Si-doped p-type composition. The p-type layer can comprise a p-type AlGaN, AlInGaN, and/or the like. It is understood that a device/heterostructure can include both the DBR structure and the p-type layer (which can be located between the DBR structure and the p-type cladding layer 22) or can include only one of the DBR structure or the p-type layer. In an embodiment, the p-type layer can be included in the device/heterostructure in place of an electron blocking layer. In another embodiment, the p-type layer can be included between the p-type cladding layer 22 and the electron blocking layer.

Figure 2:
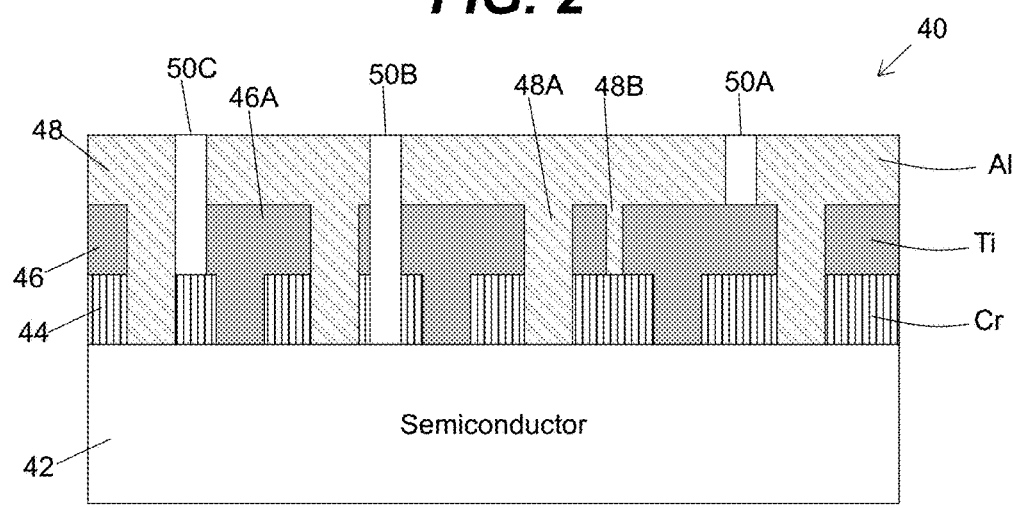
FIG. 2 shows a schematic of a multi-layered contact to a semiconductor structure according to an embodiment of the present invention that is suited for implementation with an optoelectronic device such as the one depicted in FIG. 1.

Regardless, as described herein, the n-type metal 28 and the n-type semiconductor layer 16, and/or the p-type metal 24 and the p-type semiconductor layer 22 of the emitting device 10 can be formed in accordance with one of the various embodiments described herein that includes a multi-layered contact to a semiconductor structure. For example, FIG. 2 shows a schematic of a multi-layered contact 40 to a semiconductor structure 42 according to an embodiment of the present invention that is suited for implementation with an optoelectronic device such as the one depicted in FIG. 1. In this manner, the multi-layered contact 40 is suitable for use with the n-type metal 28 and/or the p-type metal 24, while the semiconductor structure 42 is suitable for use with the n-type semiconductor layer 16 and/or the p-type semiconductor layer 22. With this configuration and the others described herein, the n-type metal 28 and the p-type metal 24 can form ohmic contacts to the n-type semiconductor layer 16 and the p-type semiconductor layer 22, respectively. In one embodiment, each of these ohmic contacts can be to a group III nitride layer in a semiconductor structure, wherein the group III nitride layer can have an Aluminum molar fraction of at least approximately 0.3 for the group III elements. Furthermore, each of these ohmic contacts can be implemented in any of the aforementioned optoelectronic and/or group III nitride-based devices. In an illustrative embodiment, contact properties of the ohmic contacts can be selected to, for example, provide the maximum light diffusive scattering.

In FIG. 2, the multi-layered contact 40 can include a discontinuous Chromium (Cr) layer 44 formed over the semiconductor structure 42. As used herein, a discontinuous layer means: a layer including one or more openings; a layer including one or more disconnected islands; and/or a discontinuous percolated layer. In an embodiment, the discontinuous layer, such as the discontinuous percolated layer, can include a sufficient number of connected regions to enable an electrical current to be conducted across the layer. As shown in FIG. 2, a discontinuous Titanium (Ti) layer 46 can be formed directly on the Chromium layer 44. In one embodiment, portions of the Titanium layer 46A can extend into or interpenetrate to at least some discontinuous sections of the Chromium layer 44. FIG. 2 further shows that the multi-layered contact 40 can further include a discontinuous Aluminum (Al) layer 48 formed directly on the Titanium layer 46. In one embodiment, portions of the Aluminum layer 48A and 48B can extend into at least some discontinuous sections of the Titanium layer 46 and the Chromium layer 44. With this configuration for the multi-layered contact 40, some portions of the Aluminum layer 48B extend only into some discontinuous sections of the Titanium layer 46 and other portions of the Aluminum layer 48A extend into some discontinuous sections of both the Titanium layer 46 and the Chromium layer 44. The discontinuous sections of the Aluminum layer 48, the Titanium layer 46 and the Chromium layer 44 can be all in alignment, none in alignment or only some sections can be in alignment. For example, in an embodiment, the discontinuous sections of the Aluminum layer 48 can be in vertical alignment with some of the discontinuous sections of both the Titanium layer 46 and the Chromium layer 44.

Semiconductor structure 42 can comprise at least one layer that comprises a semiconductor. For example, semiconductor structure 42 can comprise one or more layers/regions of: a binary, ternary, or quaternary group III-V material (e.g., AlN, GaN, InN, and/or the like) or alloy(s) thereof; diamond; any carbon modification; silicon carbide (including all polytypes or mixtures thereof); silicon; germanium; a silicon germanium alloy; and/or the like. Further, the semiconductor structure 42 may include one or more layers/regions of insulating material, metals, and/or the like. The precise configuration of layers/regions can be selected to obtain desired operating characteristic(s) of a resulting semiconductor device using any solution. In an embodiment, semiconductor structure 42 can comprise an n-type semiconductor material. In a further embodiment, the n-type semiconductor material can be a GaN-based semiconductor material, such as AlGaN, an AlGaN/GaN heterostructure, or the like. In a still further embodiment, semiconductor structure 42 can comprise a layer, such as an AlGaN layer, having a high Al composition (e.g., a group III molar fraction for aluminum of at least forty percent).

FIG. 2 shows that the multi-layered contact 40 can further include an ultraviolet transparent material 50 (50A, 50B, 50C) formed in the layers of the contact. The ultraviolet transparent material 50, which can be an ultraviolet transparent insulating material, can improve reflectivity of the radiation through an optoelectronic device which utilizes the multi-layered contact 40. Examples of an ultraviolet transparent material include, but are not limited to, $SiO_2$, sapphire, AAO, $CaF_2$, $MgF_2$, AlN, $Al_xGa_{1-x}N$ with molar fraction x selected such that $Al_xGa_{1-x}N$ is transparent to radiation of a target wavelength, thin layers of $HfO_2$, and complex layered structures, such as Bragg mirrors, comprising layered UV transparent dielectrics, and/or the like. In an embodiment, the contact 40 can be partly or entirely encapsulated by a fluoropolymer which is UV transparent. In one embodiment, the ultraviolet transparent material 50A is formed in discontinuous sections of the Aluminum layer 48. In another embodiment, the ultraviolet transparent material 50B can interpenetrate into at least some discontinuous sections of the Titanium layer 46 and the Chromium layer 44. In still another embodiment, the ultraviolet transparent material 50C can extend into at least some of the discontinuous sections of the Titanium layer 46. In this manner, some portions of the ultraviolet transparent material 50 can interpenetrate only to some discontinuous sections of the Titanium layer 46 and other portions of the ultraviolet transparent material 50 can interpenetrate to some discontinuous sections of both the Titanium layer 46 and the Chromium layer 44.

The discontinuous sections of the Chromium layer 44, the Titanium layer 46, and the Aluminum layer 48 can be formed through annealing. In one embodiment, the annealing can comprise annealing the Chromium layer 44 after formation on the semiconductor structure 42, then annealing the Titanium layer 46 after formation of the Titanium layer 46 on the Chromium layer 44, and annealing the Aluminum layer 48 after formation of the Aluminum layer 48 on the Titanium layer 46. Deposition techniques can be used in the formation of the Chromium layer 44, the Titanium layer 46 and the Aluminum layer 48. Examples of deposition techniques that can be used in the formation of the Chromium layer 44, the Titanium layer 46 and the Aluminum layer 48 can include, but are not limited to, physical vapor deposition (PVD), such as evaporation or sputtering.

In an embodiment, deposition of the contact 40 can be over a set of regions forming islands or subdomains. Furthermore, deposition of the contact 40 can be followed by etching resulting in metallic contact deposited over a set of subdomains. In an embodiment, the Chromium layer 44 can comprise a very thin layer forming a set of nano-size or few micro-size islands followed by the Titanium layer 46, and the Aluminum layer 48. The last metallic layer (e.g., the Aluminum layer 48) can be covered with a layer of gold to prevent oxidation of the metallic layers. After deposition of these metallic layers, the layers can be patterned to create subdomains. Subsequently, such subdomains can be annealed. The annealing can utilize a complicated temporal profile for the temperature. For example, the annealing temperature can initially rise to a few hundreds (e.g., 300-600) degrees Celsius, and subsequently include short pulses of high annealing temperatures that can reach as much as 1000 degrees Celsius.

It is understood that, while technologically challenging, each annealing step performed on the Chromium layer 44, the Titanium layer 46, and the Aluminum layer 48 can be substantially different for each different layer, and can be done at a temperature and/or other ambient conditions specific to that layer. In this manner, the annealing temperature and time can become parameters that are useful in optimizing the contact ohmic properties of the multi-layered contact 40. While in situ annealing of each layer in a vacuum chamber is not trivial, an embodiment can use a laser/electron beam for annealing. The beam can be shaped using an interference for example, or one can use multiple emitting sources. The metal can be partially annealed or ablated by the beam, creating a possible pattern in each layer. It is understood that such an approach may require a complicated annealing/deposition chamber design, as the annealing has to be done in vacuum without exposing metallic layers to ambient to avoid oxidation. In general, a single annealing step is performed when all the layers including the oxidation prevention gold layer are deposited in the deposition chamber.

It is understood that the annealing temperature and annealing time can be adjusted to minimize the resistance of the material that is being annealed. In general, temperature and annealing time can be adjusted using well-known techniques such as, for example, a genetic algorithm that is set to minimize the resistance of the material as a function of the temperature and time. It is understood that other properties of the multi-layered contact 40 might need to be optimized besides resistance. For example, the reflective properties of the multi-layered contact 40 can be optimized for the type of reflection (i.e., the amount of specular and diffusive reflection that is generated at the contact interface). In this scenario, the annealing temperature and/or duration can be selected for controlling interpenetration of one layer into another, which can result in improvements in reflective and/or diffusive contact characteristics for a target wavelength that can be experimentally observed (e.g., measured). Such observations can be used to optimize the reflective properties of the contact 40.

Figure 3:
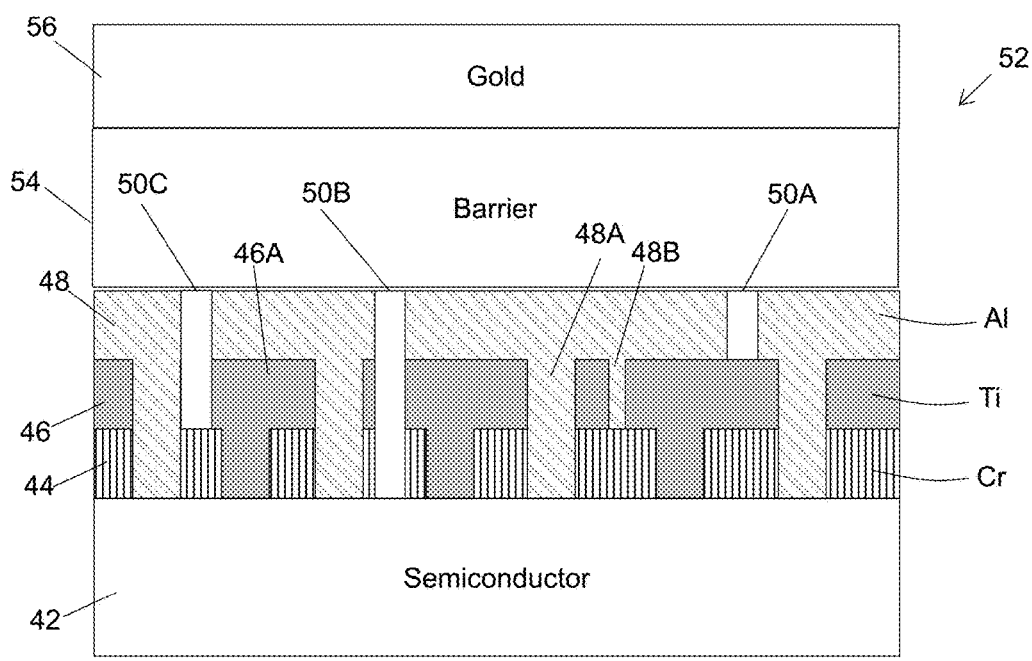
FIG. 3 shows a schematic of a multi-layered contact to a semiconductor structure that can include a barrier layer and/or a gold layer according to an embodiment of the present invention.

FIG. 3 shows a schematic of a multi-layered contact that is an alternative to the contact depicted in FIG. 2. In particular, FIG. 3 shows a schematic of a multi-layered contact 52 to the semiconductor structure 42. In this embodiment, the multi-layered contact 52 can include a barrier layer 54 and/or a gold layer 56. In one embodiment, the barrier layer 54 can be formed (e.g., deposited) directly on the Aluminum layer 48. The barrier layer 54 can comprise any metal, such as Titanium, Chromium, Nickel, Cobalt, Platinum, Lead, or the like. In another embodiment, the Gold layer 56 can be formed (e.g., deposited) directly on the barrier layer 54. In this embodiment, the barrier layer 54 can serve to improve optical properties of the device, while the Gold layer 56 on the barrier layer 54 can serve to prevent oxidation of the metallic contact when exposed to ambient.

Figure 4A:
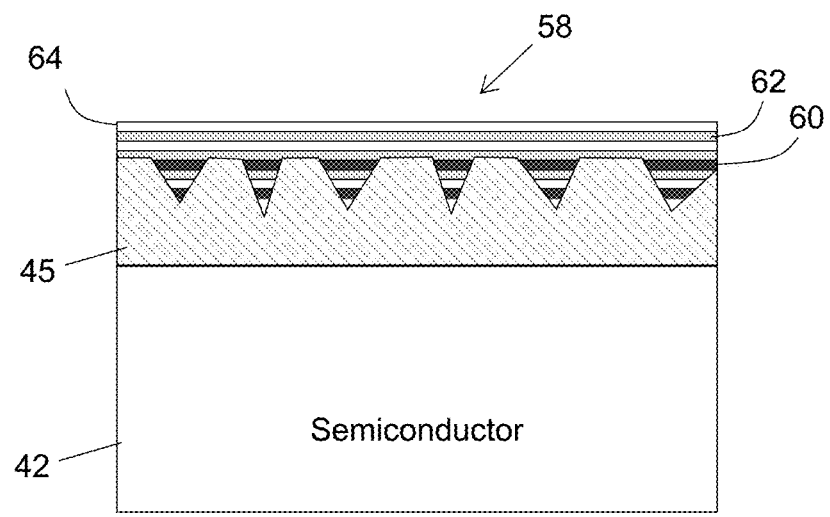
FIGS. 4A-4B illustrate a portion of a process for forming a multi-layered contact to a semiconductor structure through annealing according to an embodiment of the present invention.
Figure 4B:
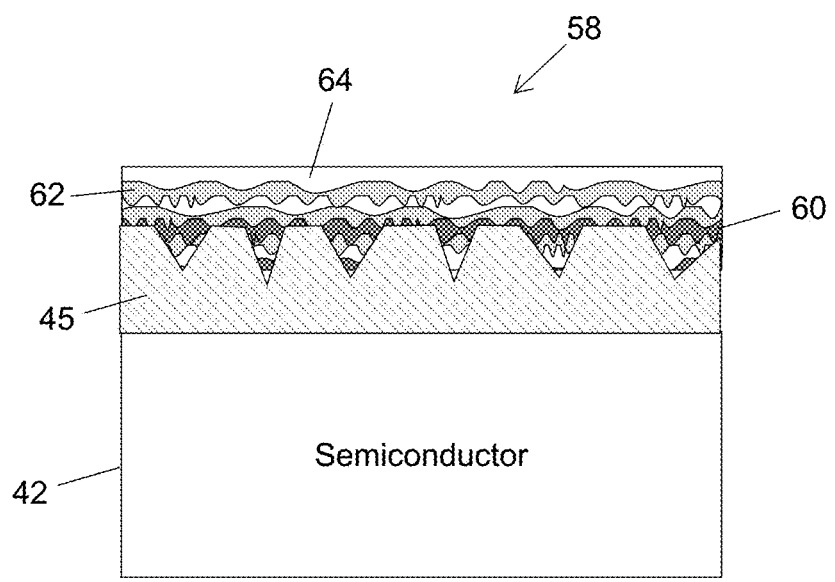

FIGS. 4A-4B illustrate a portion of a process of forming a multi-layered contact 58 to a semiconductor through annealing according to an embodiment of the present invention. The multi-layered contact 58 can be deposited over a patterned semiconductor layer 45. The metallic layers can penetrate the valleys of the semiconductor layer. In an embodiment, the patterned semiconductor layer 45 can comprise a more complicated structure. For example, when preparing a semiconductor layer, the layer can have on a surface a set of UV transparent layers that can comprise Bragg reflective mirrors. Such layers can comprise, for example, $SiO_2$ or Aluminum oxide layers. Subsequently, the layers can be patterned to allow access to the underlying semiconductor layer 45. Regardless, the semiconductor layer 45 can be a particular semiconductor layer suitable for metallic contact deposition.

The multi-layered contact 58 can be formed by first depositing a set of metallic layers 60, 62, and 64 on the semiconductor structure 42 as shown in FIG. 4A. The set of metallic layers 60, 62, and 64 can include Chromium, Titanium and Aluminum. In one embodiment, the set of metallic layers 60, 62, and 64 can be deposited on the semiconductor structure 42 in any order. In another embodiment, multiple groups of metallic layers can be deposited on the semiconductor structure. For example, a group of metallic layers can include the layers 60, 62, 64, which is deposited two or more times. Furthermore, the composition of a group can change with respect to distance from the semiconductor 42. For example, a group of layers can include Chromium near the semiconductor 42, but not include Chromium as the distance from the semiconductor 42 increases. Well-known deposition techniques, such as for example, evaporation or sputtering, can be used to deposit the metallic layers 60, 62, and 64 on the semiconductor structure 42.

After deposition of the metallic layers, an annealing operation can be performed to produce discontinuities in the metallic layers 60, 62, and 64. As shown in FIG. 4B, the annealing of the multi-layer contact 58 can result in the penetration of the metallic layers into adjacent layers. This penetration of the metallic layers 60, 62, and 64 into adjacent layers can cause inhomogeneities to form in at least one of the metallic layers 60, 62, and 64. Inhomogeneities can include changes in a thickness of the metallic layer, changes in the lateral coverage (e.g., island formation) of the metallic layer, and/or the like. The inhomogeneities can serve to improve the light scattering characteristics of the contact and the emitting device in which it is used. If desired these inhomogeneities can be used in embodiments in which the multi-layered contact has discontinuous metallic layers. In one embodiment, the inhomogeneities can each have a size that ranges from about 1 nm to 100 nm to about a few (e.g., 2-6) micrometers.

In this embodiment, the metallic layers 60, 62, and 64 can be annealed in the aforementioned manner. For example, in one embodiment, the metallic layers 60, 62, and 64 can be annealed sequentially such that each layer is annealed after deposition using the aforementioned annealing temperatures and times for each layer. In this manner, each layer can have its own characteristic annealing temperature and time. In another embodiment, the metallic layers 60, 62, and 64 can be annealed after all have been formed on the semiconductor structure 42 using the aforementioned annealing temperatures and times.

Figure 5:
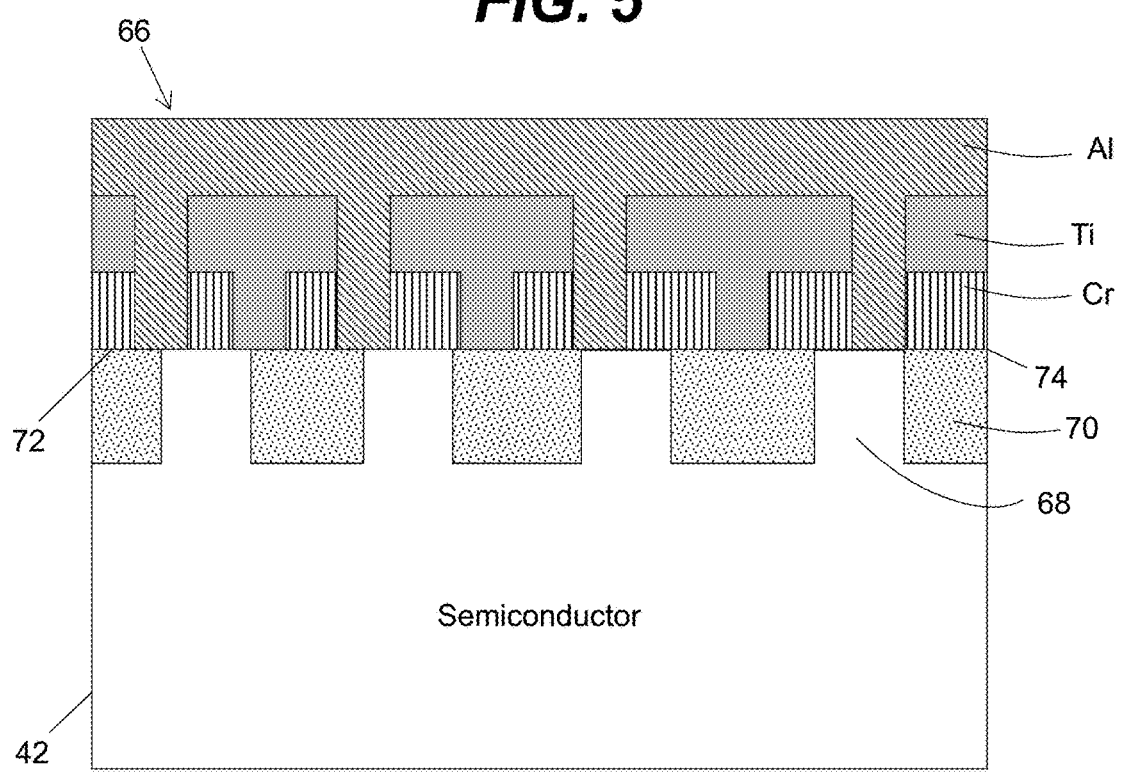
FIG. 5 shows a schematic of a multi-layered contact to a patterned semiconductor structure with ultraviolet transparent non-degrading material formed in spaces between the patterns according to an embodiment of the present invention.

FIG. 5 shows a schematic of a multi-layered contact 66 according to an embodiment of the present invention in which the semiconductor structure 42 is patterned with a plurality of patterns 68 and ultraviolet transparent non-degrading material 70 is formed in spaces 72 between the patterns. As shown in FIG. 5, a surface 74 of the semiconductor structure 42 that adjoins the multi-layered contact 66 can comprise the patterns 68, with each pattern separated from adjacent patterns by a predetermined spacing 72. In one embodiment, the patterning of the surface 74 of the semiconductor structure 42 with the plurality of patterns 68 can occur prior to formation of the multi-layered contact 66. In one embodiment, the surface 74 of the semiconductor structure 42 can be patterned using well-known photolithography techniques. Although not shown in FIG. 5, one of the metallic layers (i.e., Cr, Ti, and Al) can be patterned in an embodiment.

After patterning the surface 74 of the semiconductor structure 42, voids or depressions are left in the semiconductor in the spacings 72. In this manner, the ultraviolet transparent non-degrading material 70 can be formed in the spaces 72 between the patterns 68. The ultraviolet transparent non-degrading material 70 allows for improved light scattering and reflection of the multi-layered contact 66. Examples of the ultraviolet transparent non-degrading material 70 can include, but are not limited to, $SiO_2$, sapphire, aluminum oxide, AAO, $CaF_2$, $MgF_2$, AlN, $Al_xGa_{1-x}N$ with the molar fraction x selected such that $Al_xGa_{1-x}N$ is transparent to target radiation, and/or the like.

Figure 6A:
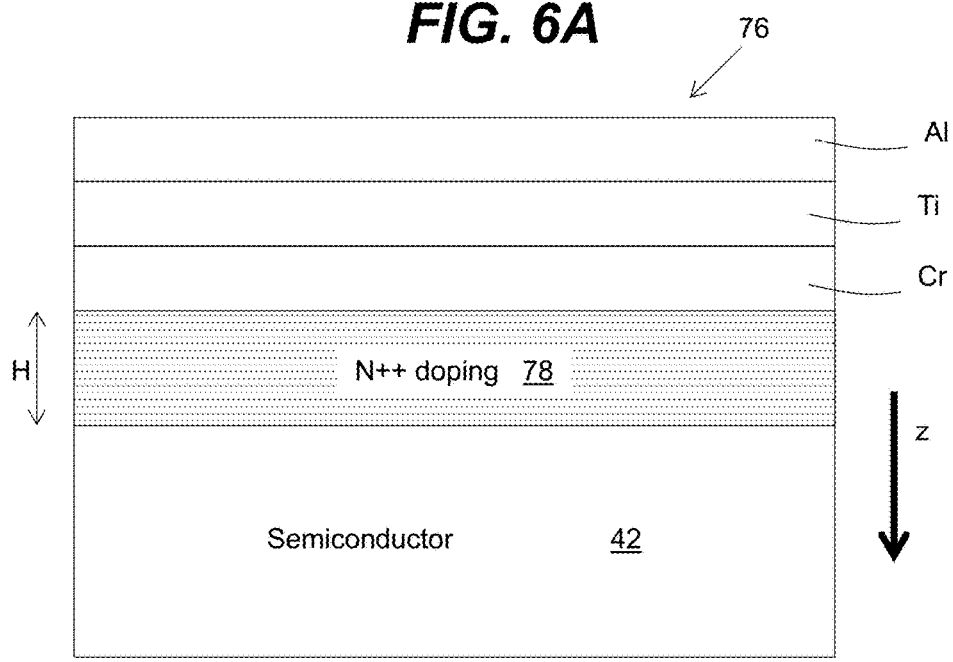

FIG. 6A shows a schematic of a multi-layered contact 76 to a semiconductor structure 42 through a semiconductor layer 78 having a thickness H and a high concentration of free carriers according to an embodiment of the present invention. In one embodiment, the semiconductor layer 78 can form a sub-layer in the topmost section of the semiconductor structure 42. In this manner, the semiconductor layer 78 containing the high concentration of free carriers can be placed between the set of metallic layers and the underlying semiconductor structure 42. In one embodiment, the semiconductor layer 78 adjoins one side of the Chromium layer, while the opposing side of the Chromium layer abuts the Titanium layer. In any event, the use of the semiconductor layer 78 with the multi-layered contact 76 serves to improve the Ohmic contact characteristics due to high doping of such a layer.

In one embodiment, the semiconductor layer 78 is a material that can include, but is not limited to, $Al_xGa_{1-x}N$ having a doping of at least $10^{18}$ dopants per cubic centimeter. In an embodiment, the dopant concentration can reach $10^{19}$ or $10^{20}$ dopants per cubic centimeter. The high concentration of free carriers in the semiconductor layer 78 can include a concentration of free carriers that is at least two times higher than a concentration of free carriers in the semiconductor structure 42.

Figure 6B:
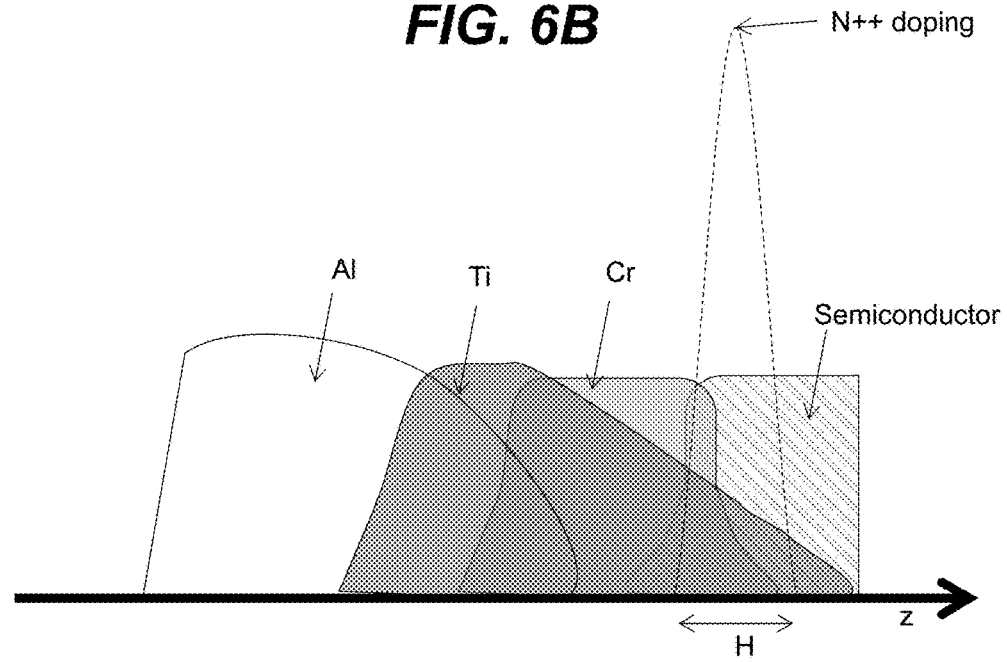
FIG. 6B illustrates doping of the free carrier in the semiconductor layer with respect to the multi-layered contact and the semiconductor structure.

The high concentration of free carriers in the semiconductor layer 78 can be achieved through increased doping. In one embodiment, the dopant concentration of the semiconductor layer 78 can be on the order of a magnitude higher than the dopant concentration of the semiconductor structure 42. FIG. 6B illustrates the doping of the free carrier in the semiconductor layer 78 with respect to the multi-layered contact 76 and the semiconductor structure 42, for an N++ type of material, with a thickness H, that has been heavily doped in relation to the metallic layers (Cr, Ti, Al) and the semiconductor 42. As shown in FIG. 6B, the doping can be a continuous function characterized by an amplitude and a thickness H, wherein the desired thickness can be selected to substantially match the characteristic length of propagation of the metallic layers within the semiconductor structure.

In one embodiment, the heavily doped semiconductor layer 78 with a high concentration of free carriers can include a semiconductor layer that has a lower bandgap than the neighboring lower semiconductor structure 42. For example, in one embodiment, the semiconductor layer 78 can contain indium (In).

In one embodiment, the semiconductor layer 78 can have a thickness H that ranges from about 10 nm to about 1 micrometer. In a more specific embodiment, the thickness H can range from about 100 nm to about 500 nm. In one embodiment, the semiconductor layer 78 can have a thickness H of at least the characteristic thickness of spreading of a metallic layer into semiconductor structure 42 through the aforementioned annealing process. Having a thickness H of at least the characteristic thickness of spreading of the metallic layer into the semiconductor structure 42 permits uniform current conduction throughout a portion of the semiconductor layer 78 and the underlying semiconductor layer 42.

Figure 7:
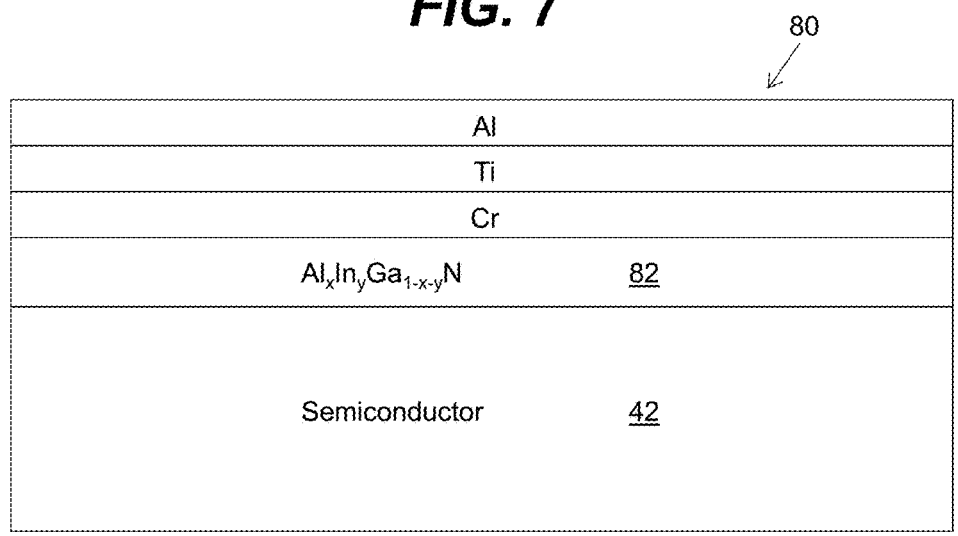
FIG. 7 shows a schematic of a multi-layered contact to a semiconductor structure through an interlayer according to an embodiment of the present invention.

FIG. 7 shows a schematic of a multi-layered contact 80 to a semiconductor structure 42 through an interlayer 82 according to an embodiment of the present invention. In one embodiment, the interlayer 82 can be an interfacial layer formed between the semiconductor structure 42 and the multi-layered contact 80. The interfacial layer can provide a discontinuous insulating layer on which the multi-layered contact 80 is formed. The interfacial layer can comprise a semi-metal, a semiconductor having an energy gap that is smaller than an energy gap of the material to which contact is made (e.g., semiconductor structure 42), an amorphous material, a doped semiconductor, and/or the like. In an embodiment, the interfacial layer can comprise aluminum gallium nitride. In an embodiment, the interfacial layer can have a thickness between approximately 10 Angstroms and approximately 1 micron. It is understood that a design of the interfacial layer can allow conductivity of current from the metallic contact 80 into a doped semiconductor layer 42. To this extent, such a semiconductor layer 42 can include portions immediately adjacent to the metallic contact 80.

As shown in FIG. 7, the interfacial layer can be formed between the Chromium layer and the semiconductor structure 42, such that the interfacial layer directly contacts the Chromium layer. In this manner, the interfacial layer can promote current spreading in the Chromium layer. In an embodiment, where the Chromium layer includes a set of discontinuous sections, the interfacial layer can be configured to also promote current spreading in the set of discontinuous sections of the Chromium layer.

In one embodiment, the interfacial layer can include a material selected from Group III-V materials. For example, in one embodiment depicted in FIG. 7, the interfacial layer can include $Al_xIn_yGa_{1-x-y}N$, where x and y are molar concentrations. The molar concentrations x and y can be selected to decrease the ionization of dopants within the material while minimizing the barrier forming at the heterojunction of the semiconductor structure 42 and the interlayer 82, or in this example, the interfacial layer. In one embodiment, the molar fractions of x and y can be chosen to have the barrier formed at the heterojunction of the semiconductor structure to be less than three thermal energies. In another embodiment, the molar fractions x and y can be selected to form an optimal Ohmic contact to the Cr/Ti/Al layers that form the multi-layer contact 80. In still another embodiment, the molar fractions x and y can be selected to values that result in an overall improvement of the multi-layer contact 80 as measured between the metallic Cr/Ti/Al layers and the underlying semiconductor structure 42.

The interlayer 82, including the interfacial layer, can be formed by utilizing an overgrowth process. In one embodiment, the overgrowth process can include a three-dimensional growth process performed as a function of temperature, a ratio of Group V/III materials used for the interlayer 82 and a three-dimensional growth rate. Values for these parameters can be selected to optimize scattering of the interface of the multi-layer contact 80. In one example, the temperature can be in the range of 600-1100 C, and the ratio of Group V/III materials used for the interlayer 82 can be on the order of 10000. In a more particular embodiment, the temperature can be lower than 1000 C and the V/III ratio can exceed 5000. It is understood that other values are possible for these parameters and that it is within the purview of those skilled in the art to select values for the parameters depending on materials and applications of the emitting devices in which these multi-layered contacts can be used. Performing an overgrowth process such as a three-dimensional growth process to form the interlayer 82 including the interfacial layer in this manner, obviates the need for etching the semiconductor structure 42.

In another embodiment, an overgrowth procedure described in U.S. Pat. No. 9,269,788, which is hereby incorporated by reference, can be used to form the interlayer 82 and the multi-layered contact 80, which can be performed without etching the semiconductor structure 42. For example, the semiconductor structure 42 can be patterned by a process including: depositing a masking material; overgrowing unmasked regions with the interlayer layer 82; and removing the masking material. The masking material can comprise any suitable material, such as $SiO_2$, $Si_3N_4$, and/or the like.

In one embodiment, a surface of the semiconductor structure 42 can undergo roughening prior to or after forming the interlayer 82 between the semiconductor structure 42 and the Chromium layer. In this manner, roughening a surface of the semiconductor structure 42 can improve light extraction from an emitting device that can include the multi-layered contact 80 and the semiconductor structure 42. Roughening a surface of the semiconductor structure 42 can include forming roughness elements on an exterior side surface of the semiconductor structure that is opposite an interface with the interlayer 82. The roughness elements can also be formed on an interior portion of the semiconductor structure 42, such as a surface of the semiconductor structure on which the interlayer 82 will be formed, or one or more edge portions. The size and shape of the roughness elements can be optimized to improve light extraction from the semiconductor structure 42. Those skilled in the art will appreciate that the roughness elements can include a variety of etched domains with sizes and shapes that are at least a wavelength of a target radiation. For example, the roughness elements can include truncated pyramids, inverted pyramids, conical elements, protrusions, externally deposited shapes, and/or the like. In another embodiment, the roughness elements can be patterned to have a periodic structure or an aperiodic structure.

In one embodiment, the interlayer 82 can be patterned with a plurality of patterns, with each pattern separated from adjacent patterns by a predetermined spacing. Although not illustrated in FIG. 7, a surface of the interlayer 82 that adjoins the multi-layered contact 80 or the semiconductor structure 42 can have the spaced patterns. In one embodiment, the patterning, which can include using any of the aforementioned well-known photolithography techniques, can be performed prior to the formation of the multi-layered contact 80. In this manner, the Chromium layer, the Titanium layer and the Aluminum layer that form the multi-layered contact 80 can be formed into each of the spacings formed between the patterns.

Figure 8:
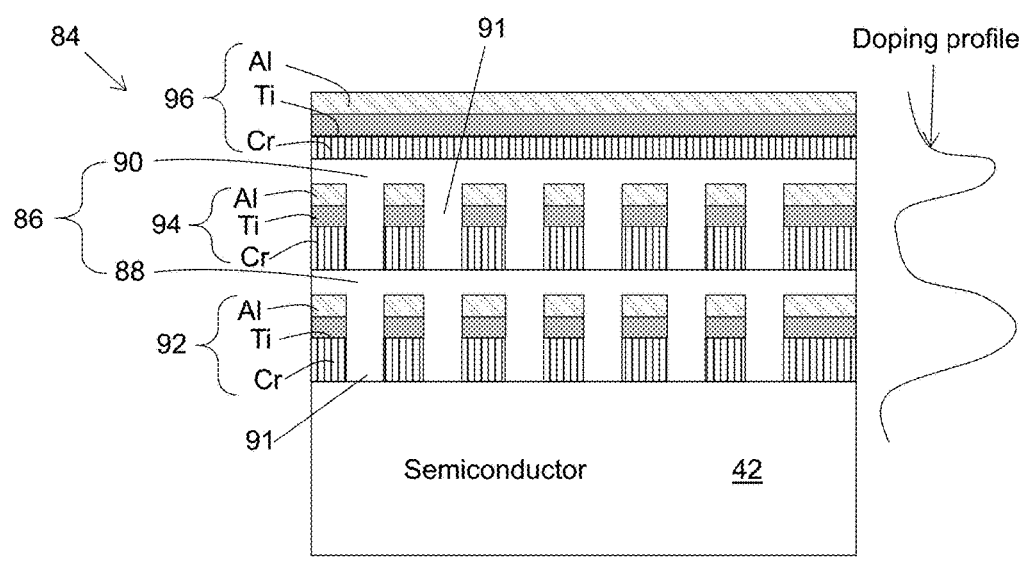
FIG. 8 shows a schematic of a multi-layered contact to a semiconductor structure through a multi-interlayer according to an embodiment of the present invention.

FIG. 8 shows a schematic of a multi-layered contact 84 to a semiconductor structure 42 through a multi-interlayer 86 according to an embodiment of the present invention. In particular, the embodiment of FIG. 8 extends the idea of an interlayer depicted in FIG. 7 to multiple interlayers and multiple metallic contact layers. For example, as shown in FIG. 8, the multi-interlayer 86 is formed on the semiconductor structure 42. The multi-interlayer 86 can include a first interlayer 88 and a second interlayer 90. It is understood that the use of two interlayers is only illustrative of the concept of using more than one interlayer between a multi-layered contact and a semiconductor structure 42, and those skilled in the art will appreciate that additional interlayers are possible.

In one embodiment, each of the semiconductor interlayers 88 and 90 can be patterned with a plurality of patterns 91, such that each pattern is separated from adjacent patterns 91 by a predetermined spacing. In this manner, the metallic layers of Chromium, Titanium and Aluminum can be deposited into the patterned interlayers 88 and 90 to form a contact to the semiconductor structure 42. For example, as shown in FIG. 8, the first interlayer 88 can include a discontinuous contact 92 having a discontinuous Chromium layer, a discontinuous Titanium layer formed on the Chromium layer, and a discontinuous Aluminum layer formed on the Titanium layer, wherein the Chromium layer, the Titanium layer and the Aluminum layer of the discontinuous contact 92 are formed in the spacing between each of the patterns 91. Similarly, the second interlayer 90 can include a discontinuous contact 94 having a discontinuous Chromium layer, a discontinuous Titanium layer formed on the Chromium layer, and a discontinuous Aluminum layer formed on the Titanium layer, wherein the Chromium layer, the Titanium layer and the Aluminum layer of the discontinuous contact 92 are formed in the spacing between each of the patterns 91. The discontinuous sections of the Chromium layer, the Titanium and the Aluminum layer of the discontinuous contact 92 and 94 can be covered by the semiconductor interlayer.

In one embodiment, the Chromium layer, the Titanium and the Aluminum layer of the discontinuous contacts 92 and 94 formed in semiconductor interlayers 88 and 90, respectively, can be in vertical alignment. However, it is understood that this arrangement is only illustrative of one possible configuration and that is not meant to limit the scope of this embodiment or any other that uses multiple interlayers. For example, a structure having more than two interlayers can have some of the discontinuous sections of some interlayers in alignment with other interlayers, while other interlayers can have their discontinuous sections not in alignment or only in partial alignment.

FIG. 8 also shows that the multi-layered contact 84 can include a contact 96 formed over the multi-interlayer 86. The contact 96 can include a Chromium layer formed on the interlayer 90, a Titanium layer formed on the Chromium layer, and an Aluminum layer formed on the Titanium layer. Having the contact 96 formed over the multi-interlayer 86 in this manner enables further optimization of electrical and/or optical properties of the contact.

In one embodiment, the interlayers 88 and 90 and their discontinuous sections of Chromium, Titanium and Aluminum can be formed through sputtering. Sputtering permits the interlayers 88 and 90 to be deposited on the semiconductor structure 42 without preserving the high crystallinity of such interlayers. For example, the metal contact layers comprising the three different metals of Chromium, Titanium, and Aluminum can be deposited in succession forming a discontinuous metallic layer for the interlayer 88. This process can be repeated for the interlayer 90 to form the discontinuous sections of the Chromium, Titanium, and Aluminum.

The materials for the semiconductor structure 42 and the multi-interlayer 86 formed from the interlayers 88 and 90 can include material selected from Group III-V materials. For example, in one embodiment, the material for these layers can include $Al_xIn_yGa_{1-x-y}N$, where x and y are molar concentrations. More specifically, the material for the semiconductor structure 42 can include $Al_{x1}In_{y1}Ga_{1-x1-y1}N$, while the material for the interlayer 88 can include $Al_{x2}In_{y2}Ga_{1-x2-y2}N$, and the material for the interlayer 90 can include $Al_{x3}In_{y3}Ga_{1-x3-y3}N$.

It is understood that the doping profile of the multi-interlayer 86 formed from the interlayers 88 and 90 and the semiconductor structure 42 can be chosen to improve the overall contact properties. FIG. 8 shows an example of a doping profile for the interlayers 88 and 90 and the semiconductor structure 42. In this example, the interlayer 88 and interlayer 90 can have a range of doping from $10^{19}$ to $10^{20}$ dopants per cubic centimeter. A doping profile shown in FIG. 8 is only a schematic example, and other doping profiles that increase conductivity of the contact can be selected base on experimentally observed contact conductivity. An advantage of using such a doping profile is associated with the fact that increased doping can lead to a decrease in mobility within the layer. As a result, there is an optimal doping that can still result in appropriate mobility. Alternatively, delta doping (known in the art of semiconductor materials) can be used.

Figure 9:
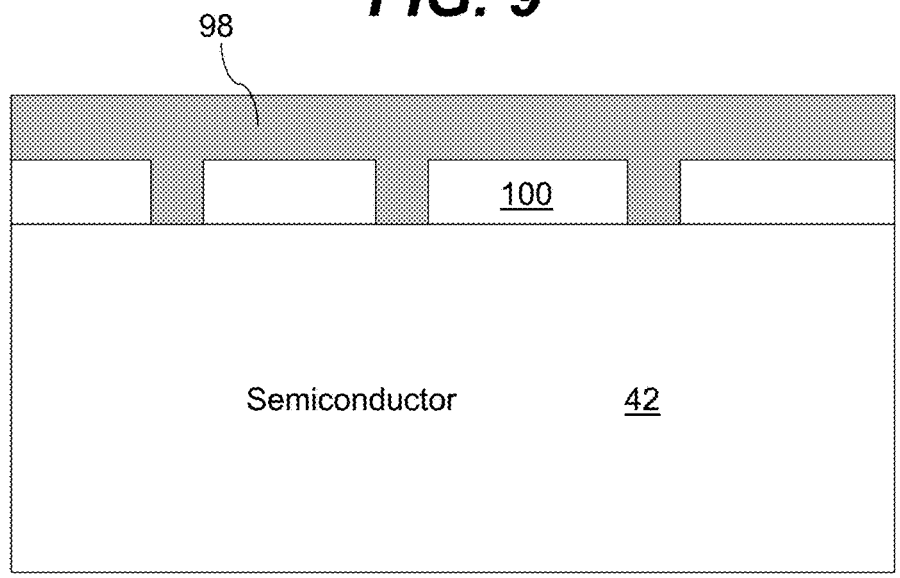
FIG. 9 shows a schematic of a semiconductor structure having a reflective layer and a contact adhesive layer formed on a surface for adjoining a multi-layered contact according to an embodiment of the present invention.

FIG. 9 shows a schematic of a semiconductor structure 42 having a reflective layer 98 and a contact adhesive layer 100 formed on a surface for adjoining a multi-layered contact according to an embodiment of the present invention. Although not shown, any one of the multi-layered contacts described herein can contact the semiconductor structure 42 via the reflective layer 98 and the contact adhesive layer 100. To this extent, a multi-layered contact described herein can be formed on a surface of the reflective layer 98 located opposite the semiconductor structure 42. As shown in FIG. 9, the contact adhesive layer 100 can include discontinuous sections formed directly on the semiconductor structure. The reflective layer 98 can be formed over the contact adhesive layer 100 such that portions of the reflective layer extend between the discontinuous sections of the contact adhesive layer to contact the semiconductor structure 42. An arrangement of the reflective layer 98 and the discontinuous sections of the contact adhesive layer 100 can improve the optical properties of the multi-layered contact that is formed with these elements.

In one embodiment, the contact adhesive layer 100 can include, but is not limited to, Nickel. In one embodiment, the contact adhesive layer 100 can be formed over the semiconductor structure 42 by an evaporation deposition method.

In one embodiment, the reflective layer 98 can include, but is not limited to, Aluminum or Rhodium. In one embodiment, the reflective layer 98 can be formed over the contact adhesive layer 100 and the semiconductor structure 42 by an evaporation deposition method or by sputtering.

Figure 10:
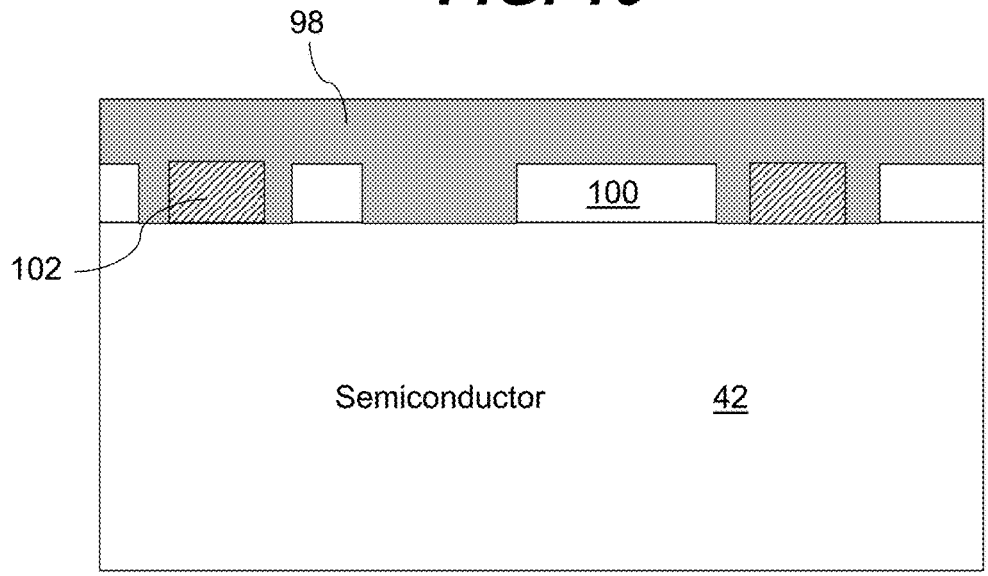
FIG. 10 shows a schematic of a semiconductor structure having a reflective layer, a contact adhesive layer, and a diffusive layer formed on a surface for adjoining a multi-layered contact according to an embodiment of the present invention.

FIG. 10 shows an alternative embodiment to the one depicted in FIG. 9. In particular, FIG. 10 shows a schematic of a semiconductor structure 42 having an ultraviolet transparent diffusive layer 102 formed on a surface of the semiconductor structure in addition to the reflective layer 98 and the contact adhesive layer 100. The diffusive layer 102 can be a material that can include, but is not limited $SiO_2$, $CaF_2$, $MgF_2$, AAO, aluminum oxide, sapphire, AlN, AlGaN and/or the like. In one embodiment, the diffusive layer 102 includes discontinuous sections that can be formed between the discontinuous sections of the reflective layer 98. For example, as shown in FIG. 10, the discontinuous sections of the diffusive layer 102 can be formed between adjacent sections of the contact adhesive layer 100, but separated from the sections of the contact adhesive layer by portions of the reflective layer 98 that extend downward to contact the semiconductor structure 42. In this manner, the reflective layer 98 surrounds the discontinuous sections of the diffusive layer 102, except for the surface that abuts the semiconductor structure 42.

The use of the discontinuous sections of the diffusive layer 102 with the reflective layer 98 and the contact adhesive layer 100 forms a good ohmic contact to the underlying semiconductor structure 42. In one embodiment, the diffusive layer 102 and its discontinuous sections can be formed with the reflective layer 98, the contact adhesive layer 100, and the semiconductor structure 42 by sputtering, for example.

Figure 11A:
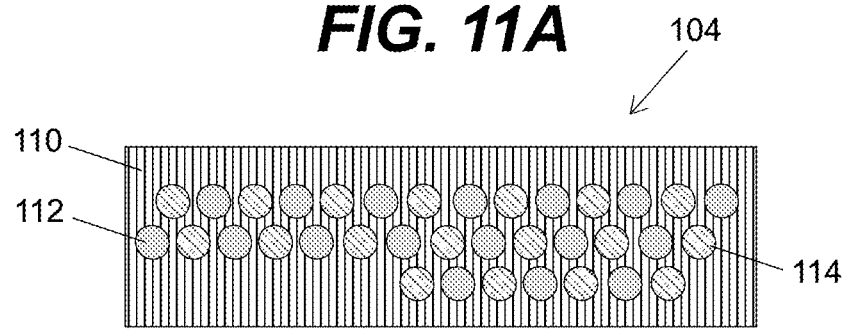
FIGS. 11A-11C show top views of examples of arrangements of metallic layers in a multi-layered contact viewed from the contact normal direction according to embodiments of the present invention.
Figure 11B:
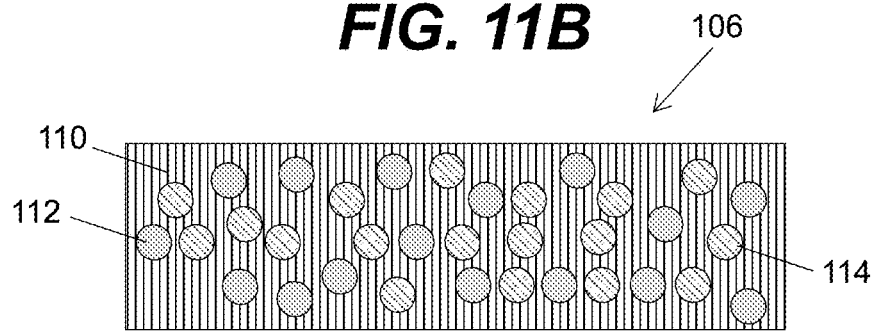
Figure 11C:
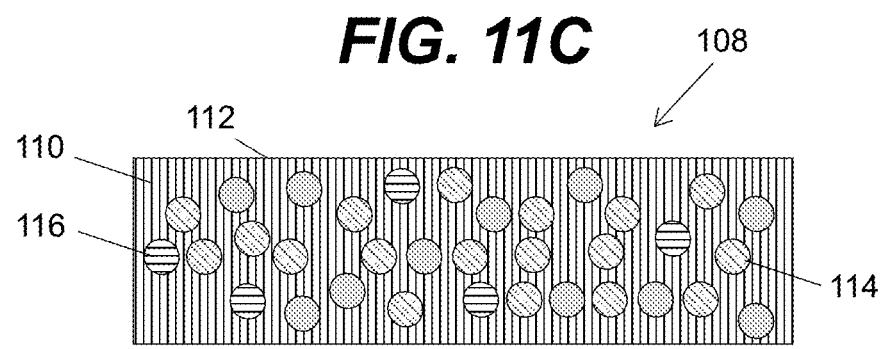

FIGS. 11A-11C show top views of examples of arrangements of metallic layers including Chromium, Titanium and Aluminum in a multi-layered contact viewed from the contact normal direction according to an embodiment of the present invention. It is understood that these arrangements depicted in FIGS. 11A-11C are illustrative of a few possible configurations of the metallic layers within a multi-layered contact and are not meant to limit the scope of the various embodiments described herein. In particular, FIGS. 11A-11C show contacts 104, 106, and 108, respectively, with multiple domains of metallic layers interspersed throughout each of the contacts. For example, a first domain 110 can contain contact with good ohmic or adhesive properties such as Chromium, while a second domain 112 can include Titanium and a third domain 114 can include Aluminum. It is understood that the designation of metals with these particular domains is only illustrative of one possible arrangement. Those skilled in the art will appreciate that the arrangement of metals can correspond with differently numbered domains. For example, in an alternative embodiment, the Aluminum can also be deposited over the domains 112, while the domains 114 can include Titanium.

The arrangement of the domains for the multi-layered contacts are suitable for implementation in a number of different configurations. For example, FIG. 11A shows that the domains 110, 112, and 114 can take the form of a periodic arrangement, while FIG. 11B shows that the domains can have an irregular (e.g., random) arrangement.

FIG. 11C shows that the contact 108 can further include domains 116 of a fourth material that can comprise a dielectric material such as, for example, $SiO_2$, $CaF_2$, $MgF_2$, AAO, aluminum oxide, sapphire, AlN, AlGaN, $HfO_2$, and/or the like. In one embodiment, the dielectric material can include an ultraviolet transparent dielectric material or a superlattice of ultraviolet transparent dielectric materials. The ultraviolet transparent dielectric materials can include, but is not limited to, $SiO_2$, $CaF_2$, $MgF_2$, AAO, aluminum oxide, sapphire, AlN, AlGaN, $HfO_2$, and/or the like. In this manner, the ultraviolet transparent dielectric materials used with the domains 116 can form a Bragg reflector. In an alternative embodiment, the ultraviolet transparent dielectric materials used with the domains 116 can form omnidirectional mirrors that can be capped with an ultraviolet reflective metallic layer.

Figure 12:
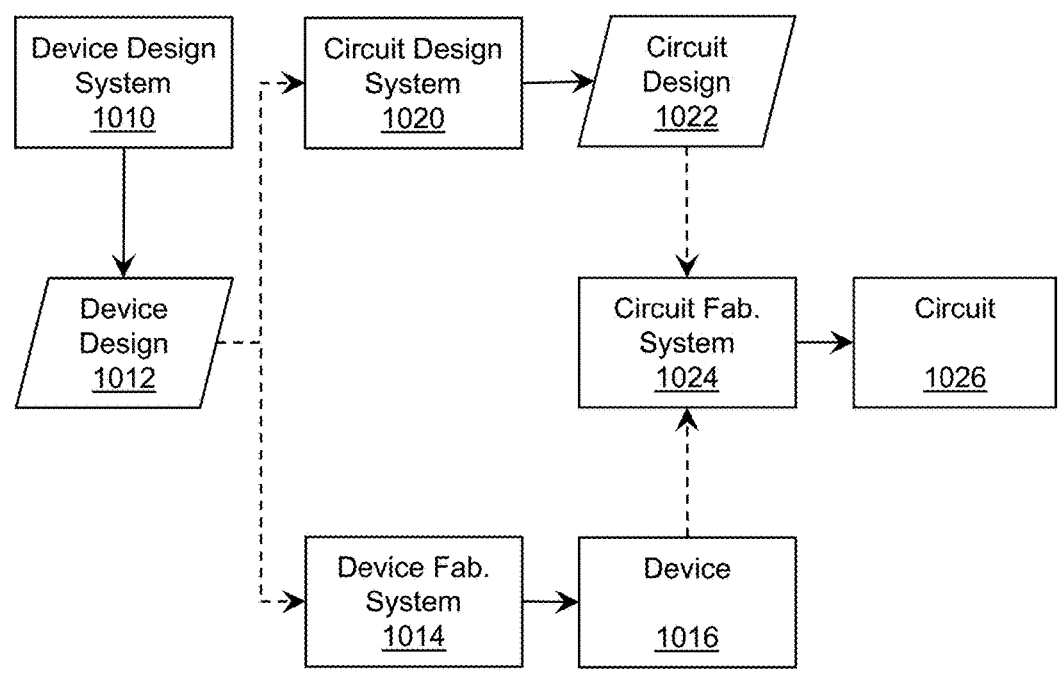
FIG. 12 shows an illustrative flow diagram for fabricating a circuit that includes one or more optoelectronic devices including the multi-layered contacts described herein according to an embodiment of the present invention.

In one embodiment, the invention provides a method of designing and/or fabricating a circuit that includes one or more of the devices designed and fabricated as described herein (e.g., including one or more devices fabricated using a contact described herein). To this extent, FIG. 12 shows an illustrative flow diagram for fabricating a circuit 1026 according to an embodiment. Initially, a user can utilize a device design system 1010 to generate a device design 1012 for a semiconductor device as described herein. The device design 1012 can comprise program code, which can be used by a device fabrication system 1014 to generate a set of physical devices 1016 according to the features defined by the device design 1012. Similarly, the device design 1012 can be provided to a circuit design system 1020 (e.g., as an available component for use in circuits), which a user can utilize to generate a circuit design 1022 (e.g., by connecting one or more inputs and outputs to various devices included in a circuit). The circuit design 1022 can comprise program code that includes a device designed as described herein. In any event, the circuit design 1022 and/or one or more physical devices 1016 can be provided to a circuit fabrication system 1024, which can generate a physical circuit 1026 according to the circuit design 1022. The physical circuit 1026 can include one or more devices 1016 designed as described herein.

In another embodiment, the invention provides a device design system 1010 for designing and/or a device fabrication system 1014 for fabricating a semiconductor device 1016 as described herein. In this case, the system 1010, 1014 can comprise a general purpose computing device, which is programmed to implement a method of designing and/or fabricating the semiconductor device 1016 as described herein. Similarly, an embodiment of the invention provides a circuit design system 1020 for designing and/or a circuit fabrication system 1024 for fabricating a circuit 1026 that includes at least one device 1016 designed and/or fabricated as described herein. In this case, the system 1020, 1024 can comprise a general purpose computing device, which is programmed to implement a method of designing and/or fabricating the circuit 1026 including at least one semiconductor device 1016 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1010 to generate the device design 1012 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1010 for designing and/or a device fabrication system 1014 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device, comprising:
    a semiconductor structure;
    a contact to the semiconductor structure, comprising:
        a discontinuous Chromium layer formed over the semiconductor structure;
        a discontinuous Titanium layer formed directly on the Chromium layer, wherein portions of the Titanium layer extend into at least some discontinuous sections of the Chromium layer; and,
        a discontinuous Aluminum layer formed directly on the Titanium layer, wherein portions of the Aluminum layer extend into at least some discontinuous sections of the Titanium layer and the Chromium layer.

2. The device of claim 1, wherein at least some portions of the Aluminum layer extend only into some discontinuous sections of the Titanium layer and other portions of the Aluminum layer extend into at least some discontinuous sections of both the Titanium layer and the Chromium layer.

3. The device of claim 1, further comprising an ultraviolet transparent material formed in at least some discontinuous sections of the Aluminum layer.

4. The device of claim 3, wherein the ultraviolet transparent material interpenetrates into at least some discontinuous sections of the Titanium layer and the Chromium layer.

5. The device of claim 4, wherein at least some portions of the ultraviolet transparent material interpenetrate only to at least some discontinuous sections of the Titanium layer and other portions of the ultraviolet transparent material interpenetrate to at least some discontinuous sections of both the Titanium layer and the Chromium layer.

6. The device of claim 1, wherein a surface of the semiconductor structure that adjoins the contact comprises a plurality of patterns, each pattern separated from adjacent patterns by a predetermined spacing, wherein the surface of the semiconductor structure comprises an ultraviolet transparent non-degrading material formed in the spacing between each of the plurality of patterns.

7. The device of claim 1, further comprising a semiconductor layer having a concentration of free carriers formed between the semiconductor structure and the contact, wherein the semiconductor layer is a sub-layer in a topmost section of the semiconductor structure, and wherein the concentration of free carriers in the semiconductor layer is at least two times higher than a concentration of free carriers in the other section of the semiconductor structure.

8. The device of claim 1, further comprising a discontinuous contact adhesive layer formed between the semiconductor structure and the contact.

9. The device of claim 8, further comprising a reflective layer formed directly on the contact adhesive layer, wherein portions of the reflective layer extend into at least some discontinuous sections of the reflective layer.

10. The device of claim 9, further comprising a diffusive layer formed in at least some of the discontinuous sections of the reflective layer.

11. The device of claim 1, wherein the discontinuous sections of the Titanium layer and the Aluminum layer form one of a periodic arrangement or an irregular arrangement in the contact viewed from a contact normal direction thereof.

12. A method, comprising:
    forming a contact to a semiconductor structure, the contact including a Chromium layer, a Titanium layer and an Aluminum layer;
    annealing the contact to form a discontinuous Chromium layer over the semiconductor structure, a discontinuous Titanium layer directly on the Chromium layer, wherein portions of the Titanium layer extend into at least some discontinuous sections of the Chromium layer, and a discontinuous Aluminum layer directly on the Titanium layer, wherein portions of the Aluminum layer extend into at least some discontinuous sections of the Titanium layer and the Chromium layer.

13. The method of claim 12, wherein the annealing comprises annealing the Chromium layer after formation on the semiconductor structure, annealing the Titanium layer after formation of the Titanium layer on the Chromium layer, and annealing the Aluminum layer after formation of the Aluminum layer on the Titanium layer.

14. The method of claim 12, wherein the annealing comprises annealing the Chromium layer, the Titanium layer, and the Aluminum layer after all have been formed on the semiconductor structure.

15. The method of claim 14, further comprising patterning a surface of the semiconductor structure with a plurality of patterns prior to formation of the contact thereto, each pattern separated from adjacent patterns by a predetermined spacing.

16. The method of claim 15, further comprising forming an ultraviolet transparent non-degrading material in the spacing between each of the plurality of patterns.

17. The method of claim 12, further comprising forming an interlayer located between the semiconductor structure and the contact, wherein the Chromium layer is directly on the interlayer, and wherein the interlayer is formed of a material configured to promote current spreading in a set of discontinuous sections of the Chromium layer.

* * * * *